US008829923B2

(12) United States Patent
Sheikman et al.

(10) Patent No.: US 8,829,923 B2
(45) Date of Patent: Sep. 9, 2014

(54) PROXIMITY SENSOR ASSEMBLY AND INSPECTION SYSTEM

(75) Inventors: Boris Leonid Sheikman, Minden, NV (US); Steven Go, Schenectady, NY (US); Joseph Lee Whiteley, Gardnerville, NV (US); Nathan Andrew Weller, Gardnerville, NV (US); Susan Lee Roush, Gardnerville, NV (US); Yongjae Lee, Niskayuna, NY (US)

(73) Assignee: General Electric Company, Schenectady, NY (US)

(*) Notice: Subject to any disclaimer, the term of this patent is extended or adjusted under 35 U.S.C. 154(b) by 398 days.

(21) Appl. No.: 13/294,515

(22) Filed: Nov. 11, 2011

(65) Prior Publication Data

US 2013/0120003 A1    May 16, 2013

(51) Int. Cl.
*G01R 27/32*    (2006.01)
*G01R 27/26*    (2006.01)
*F01D 11/06*    (2006.01)
*G08B 13/24*    (2006.01)
*H03K 17/945*    (2006.01)
*F02C 9/00*    (2006.01)
*F01D 17/20*    (2006.01)

(52) U.S. Cl.
CPC .............. *H03K 17/945* (2013.01); *F01D 11/06* (2013.01); *G08B 13/2491* (2013.01); *F02C 9/00* (2013.01); *F01D 17/20* (2013.01)

USPC ........................................................ 324/637
(58) Field of Classification Search
CPC ......... H03K 17/945; F02C 9/00; F01D 11/06; F01D 17/20; G08B 13/249
USPC .................................................. 324/630–690
See application file for complete search history.

(56) References Cited

U.S. PATENT DOCUMENTS

| 4,313,118 | A | 1/1982 | Calvin |
| 4,631,505 | A | 12/1986 | Schiavone |
| 4,652,864 | A * | 3/1987 | Calvin ........................... 340/553 |
| 4,845,422 | A | 7/1989 | Damon |
| 4,862,061 | A | 8/1989 | Damon |
| 5,452,718 | A * | 9/1995 | Clare et al. .................... 600/396 |
| 6,452,568 | B1 * | 9/2002 | Zidek ............................ 343/895 |
| 6,590,150 | B1 * | 7/2003 | Kiefer ........................... 136/258 |
| 2004/0196192 | A1 * | 10/2004 | Boyd et al. .............. 343/700 MS |
| 2011/0144463 | A1 | 6/2011 | Pesach et al. |
| 2012/0050114 | A1 * | 3/2012 | Li et al. ......................... 343/702 |

* cited by examiner

*Primary Examiner* — Jermele M Hollington
*Assistant Examiner* — Farhana Hoque
(74) *Attorney, Agent, or Firm* — Hiscock & Barclay LLP

(57) ABSTRACT

A proximity sensor assembly with a sensing element having a substrate and an antenna pattern disposed on one or more planar surfaces of the substrate is disclosed. The cable is fed substantially parallel to the planar surfaces of the substrate and is attached to the side surface of the substrate, such that the cable is oriented substantially perpendicular to the direction of the electromagnetic field emitted from the sensing element.

20 Claims, 3 Drawing Sheets

PROXIMITY SENSOR ASSEMBLY AND INSPECTION SYSTEM

BACKGROUND OF THE INVENTION

The subject matter disclosed herein relates to a proximity sensor assembly and inspection system.

Proximity sensors, including eddy current sensors, magnetic pick up sensors, and capacitive sensors, can be used to monitor the vibration, movement, or other operational characteristics of a machine (e.g., a turbine) by measuring the distance between the proximity sensor and the machine. In an example of dynamic detection, a proximity sensor can be used to detect the frequency of the vibration of a machine component (e.g., vibration of the rotating shaft of a turbine) by monitoring any changes in the position of a machine component relative to the proximity sensor as the machine component vibrates. In an example of static detection, a proximity sensor can be used to detect the expansion of a machine component as it warms up and expands, causing the machine component to move closer to the proximity sensor, or to measure the contraction of a machine component as it cools down and contracts, causing the machine component to move further from the proximity sensor. The proximity sensor can provide information about the operational characteristics of a machine component to other components of an inspection system. The monitoring, control, and inspection system displays graphical representations of the operational characteristics of the machine component, and provides an alarm or other indication when there is abnormal behavior of the machine component.

Proximity sensors typically have a tubular/cylindrical shape with a cable that is fed through a portion of the length of the cylinder and connected to a center location in the cylinder, with the proximity detection signal being emitted from a top surface of the sensor in a direction parallel with the cable. The length of this cylindrical proximity sensor and the direction of the proximity detection signal requires sufficient clearance near a target object in order to install the proximity sensor to monitor the object, preventing the use of the proximity sensor in areas having narrow clearances around the object. Also, in some applications, the cylindrical proximity sensor cannot be used where a hole cannot be drilled or a bracket cannot be installed to mount the proximity sensor.

The discussion above is merely provided for general background information and is not intended to be used as an aid in determining the scope of the claimed subject matter.

BRIEF DESCRIPTION OF THE INVENTION

A proximity sensor assembly with a sensing element having a substrate and an antenna disposed on one or more planar surfaces of the substrate is disclosed. The cable is fed substantially parallel to the planar surfaces of the substrate and is attached to the side surface of the substrate, such that the cable is oriented substantially perpendicular to the direction of the electromagnetic field emitted from the sensing element. An advantage that may be realized in the practice of some disclosed embodiments of the proximity sensor assembly is that the proximity sensor assembly has a short, low profile and is capable of being inserted within slots, slits, cracks, or other areas with narrow clearances around a target object.

In one embodiment, an exemplary proximity sensor assembly is disclosed. The proximity sensor assembly comprises a substrate comprising a first planar surface, a second planar surface, and a side surface, wherein the second planar surface is substantially opposite the first planar surface of the substrate, an antenna pattern disposed on the first planar surface and/or the second planar surface of the substrate, a cable comprising a center conductor and a shield, wherein the cable is connected to the side surface of the substrate and is substantially parallel to the first planar surface and the second planar surface of the substrate, a first conductive path in the substrate connecting the center conductor of the cable to the antenna pattern, and a second conductive path in the substrate connecting the shield of the cable to the antenna pattern.

In another embodiment, an exemplary inspection system for inspecting an object is disclosed. The inspection system comprises a proximity sensor located proximate to the object, wherein the proximity sensor comprises a substrate comprising a first planar surface, a second planar surface, and a side surface and an antenna pattern disposed on the first planar surface and/or the second planar surface of the substrate, wherein the second planar surface is substantially opposite the first planar surface of the substrate, a signal generation and processing component for generating an electrical driving signal that causes generation of an electromagnetic field from the proximity sensor that is directed toward the object, a cable connecting the signal generation and processing component and the proximity sensor, wherein the cable comprises a center conductor and a shield and wherein the cable is connected to the side surface of the substrate and is substantially parallel to the first planar surface and the second planar surface of the substrate, a first conductive path in the substrate connecting the center conductor of the cable to the antenna pattern, and a second conductive path in the substrate connecting the shield of the cable to the antenna pattern.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of the invention. In the drawings, like numerals are used to indicate like parts throughout the various views. Thus, for further understanding of the invention, reference can be made to the following detailed description, read in connection with the drawings in which.

DETAILED DESCRIPTION OF THE INVENTION

Figure 1:
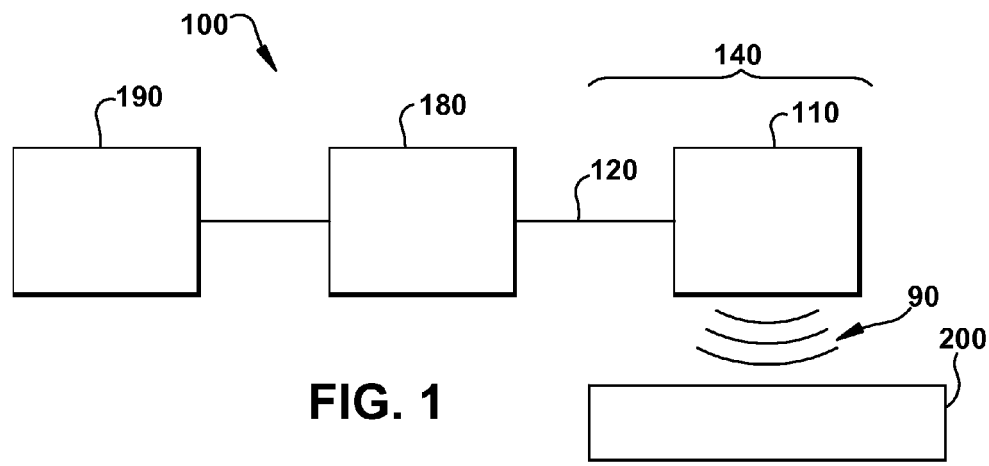
FIG. 1 is a diagram of an exemplary inspection system.

FIG. 1 is a diagram of an exemplary inspection system 100 that can measure, monitor, and inspect an object 200 (e.g., a turbine component). The inspection system 100 comprises a proximity sensor 110 connected by a cable 120 to a signal generation and processing component 180, which can be connected to a diagnostic monitor 190. The proximity sensor 110 and cable 120 are collectively referred to herein as a proximity sensor assembly 140.

The signal generation and processing component 180 outputs an electrical driving signal to the proximity sensor 110 that causes the proximity sensor 110 to generate an electromagnetic field 90 that projects away from the proximity sensor 110. In one embodiment, the electrical driving signal is a signal having a frequency in the microwave range, and is also referred to herein as a microwave driving signal. As used herein, the term "microwave" refers to electrical signals with frequencies of about 300 MHz or greater and, in one example, from about 300 MHz to about 300 GHz.

In one embodiment, the proximity sensor 110 and the object 200 are located sufficiently proximate to each other such that there is capacitive and/or inductive coupling between the proximity sensor 110 and the object 200. The close distance between the proximity sensor 110 and the object 200 distorts the electromagnetic field 90, which affects the power level and/or the frequency and/or phase of the electromagnetic field 90, which can be sensed by the proximity sensor 110. The power level and/or the frequency and/or phase of the electromagnetic field 90 change based on the distance between the proximity sensor 110 and the object, and are monitored by the signal generation and processing component 180 to determine the distance between the proximity sensor 110 and the object 200 over time, which can be used to determine, e.g., the vibration, position, etc., of the object 200 over time.

In one embodiment, the diagnostic monitor 190 can be an independent component that receives signals from the signal generation and processing component 180 that are representative of the distance between the proximity sensor 110 the object 200. The diagnostic monitor 190 can process these signals, generating one or more output signals, which can be transmitted to additional components such as a display, a supervisory control and data acquisition (SCADA) system, etc., that can display a textual and/or graphical representation of the operating characteristics of the object (e.g., vibration, position, etc.) over time and relative to a location of the proximity sensor 110.

Figure 2:
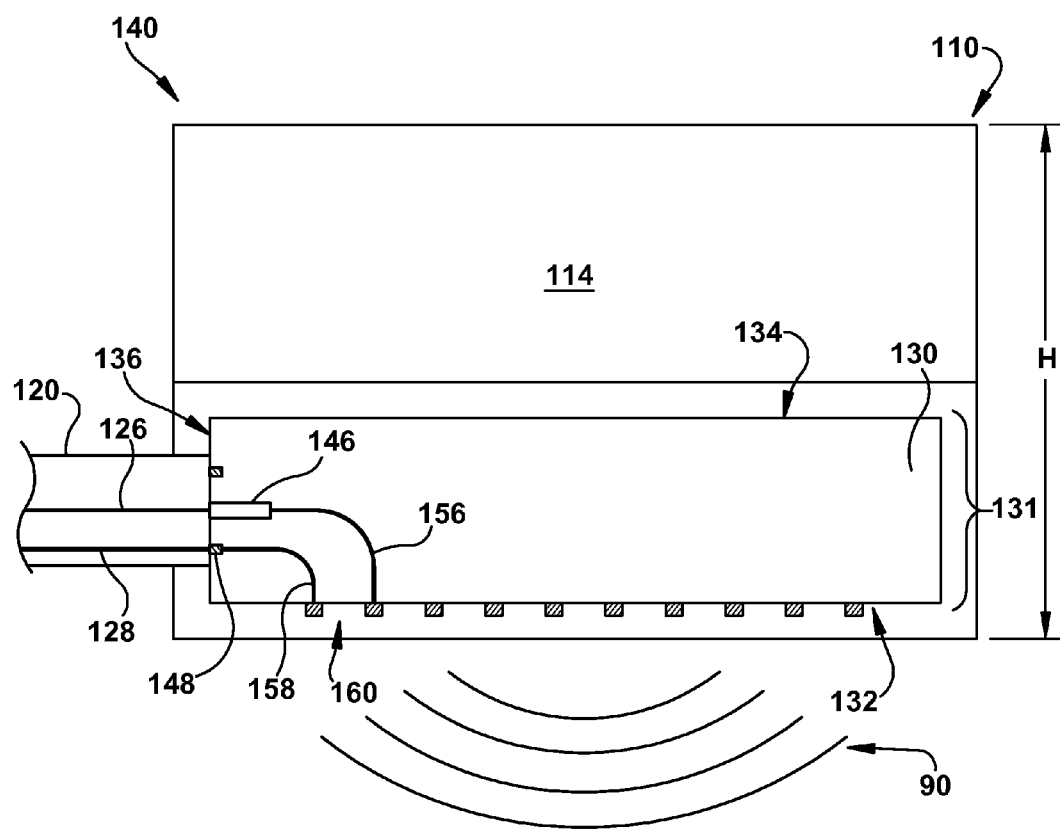
FIG. 2 is a side cross-sectional view of an exemplary proximity sensor assembly.
Figure 3:
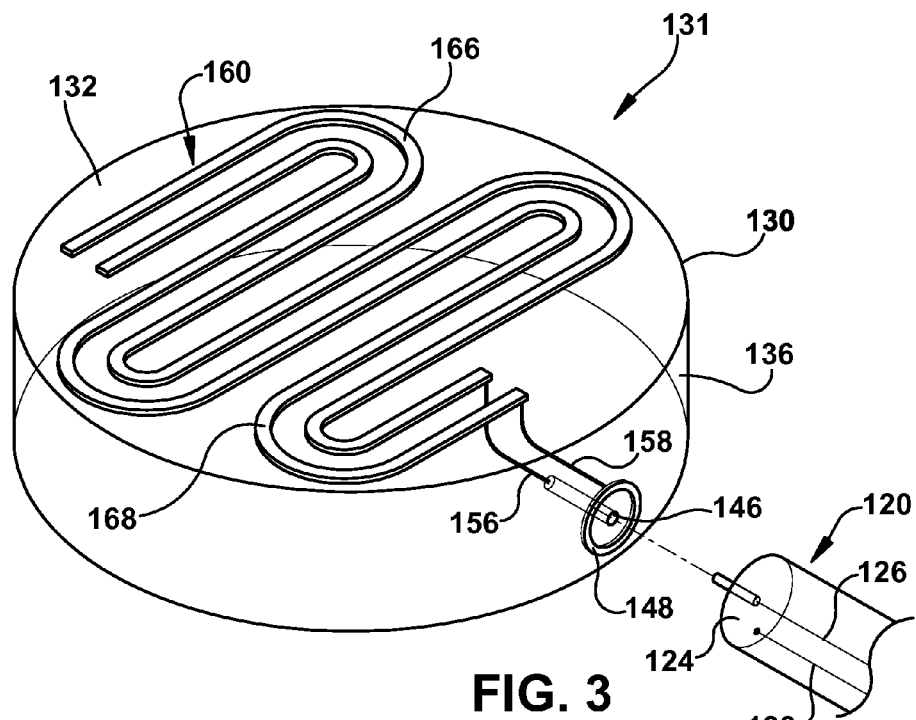
FIG. 3 is a diagram of the sensing element inside the proximity sensor assembly of FIG. 2.

FIG. 2 is a diagram illustrating a side cross-sectional view of an exemplary proximity sensor assembly 140 having a proximity sensor 110 and a cable 120. FIG. 3 is a diagram of the sensing element 131 inside the proximity sensor assembly 140 of FIG. 2. The proximity sensor 110 can include a substrate 130 having first planar surface 132 and second planar surface 134, substantially opposite the first planar surface 132. The side surface 136 of the substrate is substantially perpendicular to the first planar surface 132 and the second planar surface 134 of the substrate 130. In this embodiment, since the substrate 130 has a circular profile with respect to a viewing perspective that is perpendicular to the planar surfaces 132 and 134, the side surface 136 of the substrate 130 forms the perimeter of the substrate 130 and is curved, although other shapes for the substrate 130 and side surface 136 can be used. An antenna pattern 160 is disposed on the first planar surface 132 of the substrate 130 and emits an electromagnetic field 90 towards the object 200 (see FIG. 1). The substrate 130 and the antenna pattern 160 are collectively referred to herein as a sensing element 131. A tuned cavity 114 can be located proximate to the second planar surface 134 of the substrate 130. The tuned cavity 114 can be designed to facilitate the tuning of characteristics of the electromagnetic field 90 being emitted from the sensing element 131. The tuned cavity 114 can reflect the portion of the electromagnetic field 90 radiating backwards in the proximity sensor 110, making the electromagnetic field 90 go towards the object 200. In one embodiment, the depth of the tuned cavity 114 is a multiple of a wavelength of the electrical driving signal (e.g. ½ wavelength, ¼ wavelength) and can be adjusted based on the specific antenna pattern 160.

In the embodiment shown in FIGS. 2 and 3, the cable 120 is connected to a side surface 136 of the substrate 130 of the proximity sensor 110, such that the cable 120 is substantially parallel to the substrate 130, including the first planar surface 132 and the antenna pattern 160. The cable 120 can be fed to the proximity sensor 110 such that the cable 110 is substantially parallel to the antenna pattern 160, and, therefore, also perpendicular to the direction of the electromagnetic field 90 being emitted from the sensing element 131. Hence, a proximity measurement can be made in a direction that is substantially perpendicular to the direction of the cable 120 connected to the proximity sensor 110. This configuration can be referred to as a "right angle" type of proximity sensor 110. This type of design enables the proximity sensor 110 and the cable 130 to have a relatively thin profile (H) (see FIG. 2) when being positioned near an object, enabling the proximity sensor 110 to be inserted into slots, slits, cracks, or other areas with narrow clearances providing access to a target object 200.

The exemplary cable 120 (e.g., a coaxial cable, triax, twisted pair with a shield) of the proximity sensor assembly 140 can be a multi-conductor cable and can include a center conductor 126 (also referred to as a core) and a shield 128 (also referred to as a ground). To electrically connect to the cable 120 to the antenna pattern 160 of the proximity sensor 110, the substrate 130 can include a first conductive path 156 that provides an electrical connection between the center conductor 126 of the cable 120 and the antenna pattern 160. The substrate 130 can also include a second conductive path 158 that provides an electrical connection between the shield 128 of the cable 120 and the antenna pattern 160.

As shown in FIGS. 2 and 3, in one embodiment, the center conductor 126 of the cable 120 can extend into, and be connected (e.g., by soldering, laser welding, bonding, etc.) to a conductive pin 146 recessed in a hole in the side surface 136 of the substrate 130 that is electrically connected to the antenna pattern 160 via the first conductive path 156 in the substrate 130. The conductive pin 146 can be inserted into a hole formed by drilling hole in the side surface 136 of the substrate 130. In one embodiment, the shield 128 of the cable 120 can be connected to a conductive ring 148 on the side surface 136 of the substrate 130 that is electrically connected to the antenna pattern 160 via the second conductive path 156 in the substrate 130. In one embodiment, the conductive ring 148 surrounds the conductive pin 146.

In another embodiment where the substrate 130 is made of two or more layers bonded together, the conductive pin 146 could be formed from at least two separate portions located in grooves on each layer of the substrate 130 that would form a narrow cavity to receive the conductive pin 146 when the layers were joined. Such a groove within each layer could have a radius of greater than or equal to the radius of the center conductor 126 of the cable 120. Similarly, if the substrate 130 is made of two or more layers bonded together, the conductive ring 148 could be formed from two separate portions located in each layer of the substrate 130 that would form the conductive ring 148 when the layers were joined. As shown in FIG. 3, in order to facilitate connection of the cable 120 to the side surface of the substrate 130, the cable 120 can be cut in a profile matching the contour (e.g., round, elliptical, star-shaped) of the side surface 136 of the substrate 130 such that the face 124 of the cable 120 has substantially the same shape as the substrate 130 and will abut the side surface 136.

Figure 4:
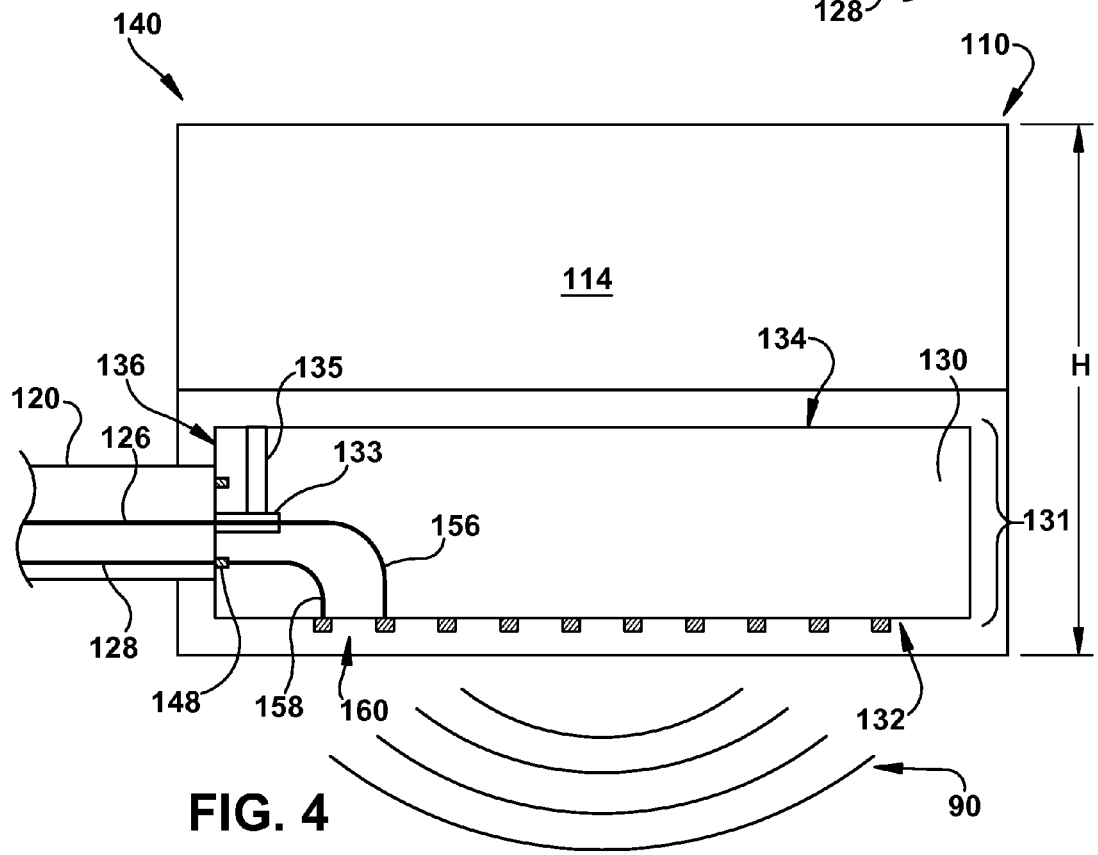
FIG. 4 is a side cross-sectional view of another exemplary proximity sensor assembly.

In yet another embodiment shown in FIG. 4, rather than connect the center conductor 126 of the cable 120 to the conductive pin 146 in the side surface 136 of the substrate 130 as shown in FIGS. 2 and 3, the exposed center conductor 126 of a stripped back cable 120 can be inserted into a first hole 133 in the side surface 136 of the substrate 130 and then be electrically connected (e.g., by soldering, laser welding, bonding, etc.) to the antenna pattern 160 via the first conductive path 156 in the substrate 130. In one embodiment, a second hole 135 may be formed in the second planar surface 134 of the substrate 130 to provide access the center conductor 126 inserted into the first hole 133 for soldering the center conductor 126 to the first conductive path 156.

In the embodiment shown in FIG. 3, the exemplary antenna pattern 160 is configured as a dipole antenna, with a first portion 166 connected to the center conductor 126 of the cable 120 via the first conductive path 156 and the conductive pin 146, while a second portion 168 is connected to the shield 128 of the cable 120 via the second conductive path 158 and the conductive ring 148. In some embodiments, the antenna pattern 160 is structured into a shape other than the serpentine shape shown in FIG. 3. For example, in some embodiments, the antenna could be structured to include spirals or an accordion type of pattern.

Figure 5:
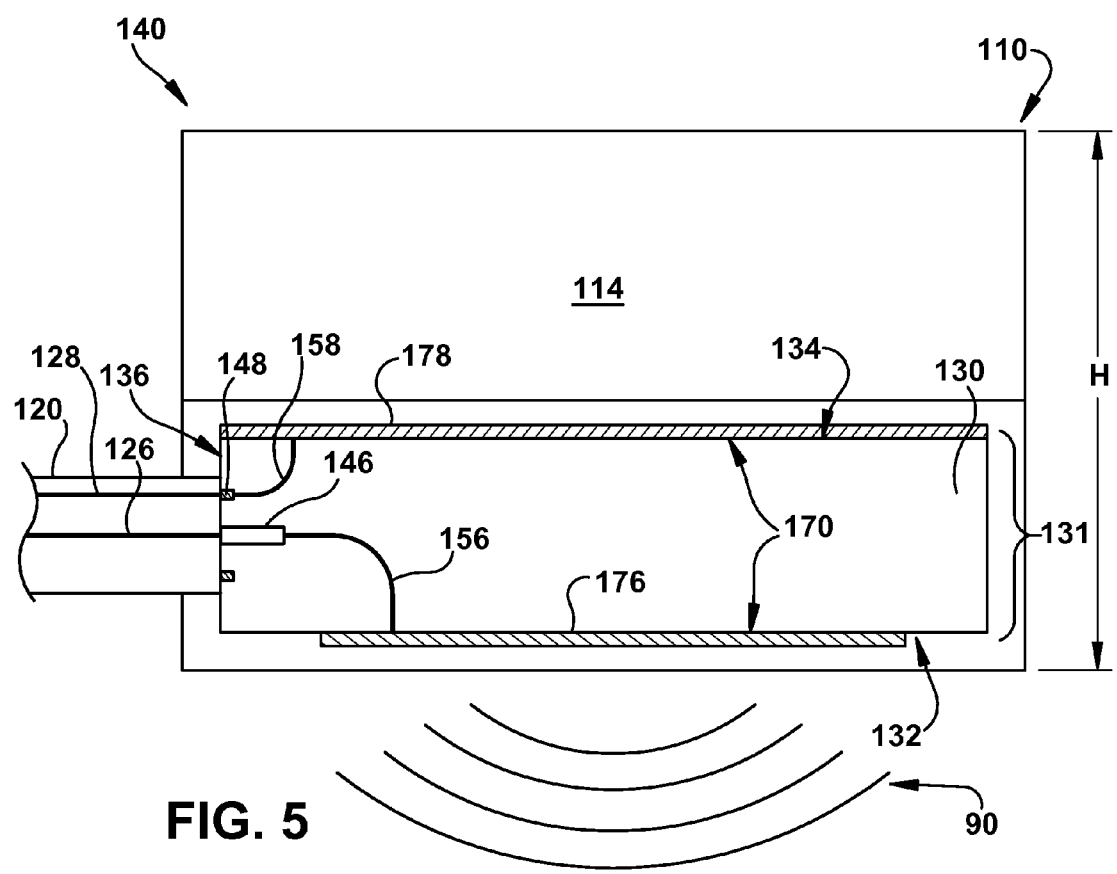
FIG. 5 is a side cross-sectional view of yet another exemplary proximity sensor assembly.

In another embodiment shown in FIG. 5, the antenna pattern 170 can be disposed on both the first planar surface 132 and the second planar surface 134 of the substrate 130. For example, the antenna pattern 170 can be a patch antenna in the form of a first patch of conductive material (e.g., metal) 176 covering at least a portion of the first planar surface 132 and a second patch of conductive material 178 covering the second planar surface 134 (e.g., forming a ground plane). To electrically connect to the cable 120 to the antenna pattern 170 of the proximity sensor 110, the substrate 130 can include a first conductive path 156 that provides an electrical connection between the center conductor 126 of the cable 120 and the first patch of conductive material 176 of the antenna pattern 170. The substrate 130 can also include a second conductive path 158 that provides an electrical connection between the shield 128 of the cable 120 and the second patch of conductive material 178 of the antenna pattern 170.

This written description uses examples to disclose embodiments of the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A proximity sensor assembly comprising:
   a substrate comprising a first planar surface disposed in a first plane, a second planar surface disposed in a second plane, and a side surface, wherein the second planar surface of the substrate is substantially opposite the first planar surface of the substrate, and wherein the first plane is parallel to the second plane;
   an antenna pattern disposed on the first planar surface and/or the second planar surface of the substrate;
   a cable comprising a center conductor and a shield, wherein the cable is connected to the side surface of the substrate and is disposed in a third plane substantially parallel to the first plane and the second plane;
   a first conductive path in the substrate connecting the center conductor of the cable to the antenna pattern; and
   a second conductive path in the substrate connecting the shield of the cable to the antenna pattern.

2. The proximity sensor assembly of claim 1, further comprising a conductive pin recessed in the side surface of the substrate, wherein the conductive pin is electrically connected to the antenna pattern via the first conductive path in the substrate and wherein the center conductor of the cable is connected to the conductive pin.

3. The proximity sensor assembly of claim 1, further comprising a conductive ring on the side surface of the substrate, wherein the conductive ring is electrically connected to the antenna pattern via the second conductive path in the substrate and wherein the shield of the cable is connected to the conductive ring.

4. The proximity sensor assembly of claim 1, wherein the cable is cut in a profile matching the contour of the side surface of the substrate.

5. The proximity sensor assembly of claim 1, wherein the antenna pattern is a dipole antenna disposed on the first planar surface of the substrate and wherein the first conducive path is connected to a first portion of the dipole antenna and the second conductive path is connected to a second portion of the dipole antenna.

6. The proximity sensor assembly of claim 1, wherein the antenna pattern is a patch antenna disposed on the first planar surface and the second planar surface of the substrate and wherein the first conducive path is connected to a first portion of the patch antenna on the first planar surface of the substrate and the second conductive path is connected to a second portion of the patch antenna on the second planar surface of the substrate.

7. The proximity sensor assembly of claim 1, further comprising a tuning cavity proximate a second planar surface of the substrate.

8. The proximity sensor assembly of claim 1, wherein the substrate is a single layer.

9. The proximity sensor assembly of claim 1, wherein the side surface of the substrate is substantially perpendicular to the first planar surface and the second planar surface of the substrate.

10. A proximity sensor assembly comprising:
    a substrate comprising a first planar surface, a second planar surface, and a side surface, wherein the second planar surface of the substrate is substantially opposite the first planar surface of the substrate;
    an antenna pattern disposed on the first planar surface and/or the second planar surface of the substrate;
    a cable comprising a center conductor and a shield, wherein the cable is connected to the side surface of the substrate and is substantially parallel to the first planar surface and the second planar surface of the substrate;

a first conductive path in the substrate connecting the center conductor of the cable to the antenna pattern;

a second conductive path in the substrate connecting the shield of the cable to the antenna pattern; and a first hole in the side surface of the substrate into which the center conductor of the cable is inserted and electrically connected to the antenna pattern via the first conductive path in the substrate.

11. The proximity sensor assembly of claim 10, further comprising a second hole in the first planar surface or the second planar surface of the substrate, wherein the second hole provides access to the center conductor inserted into the first hole for soldering the center conductor to the first conductive path.

12. An inspection system for inspecting an object comprising:

a proximity sensor located proximate to the object, wherein the proximity sensor comprises a substrate comprising a first planar surface disposed in a first plane, a second planar surface disposed in a second plane, and a side surface, and an antenna pattern disposed on the first planar surface and/or the second planar surface of the substrate, wherein the second planar surface of the substrate is substantially opposite the first planar surface of the substrate, and wherein the first plane is parallel to the second plane;

a signal generation and processing component for generating an electrical driving signal that causes generation of an electromagnetic field from the proximity sensor that is directed toward the object, a cable connecting the signal generation and processing component and the proximity sensor, wherein the cable comprises a center conductor and a shield and wherein the cable is connected to the side surface of the substrate and is disposed in a third plane substantially parallel to the first plane and the second plane;

a first conductive path in the substrate connecting the center conductor of the cable to the antenna pattern; and a second conductive path in the substrate connecting the shield of the cable to the antenna pattern.

13. The inspection system of claim 12, wherein the electrical driving signal is a microwave signal.

14. The inspection system of claim 13, wherein the microwave signal has a frequency of between 300 MHz to 300 GHz.

15. The inspection system of claim 12, further comprising a conductive pin recessed in the side surface of the substrate, wherein the conductive pin is electrically connected to the antenna pattern via the first conductive path in the substrate and wherein the center conductor of the cable is connected to the conductive pin.

16. The inspection system of claim 12, further comprising a conductive ring on the side surface of the substrate, wherein the conductive ring is electrically connected to the antenna pattern via the second conductive path in the substrate and wherein the shield of the cable is connected to the conductive ring.

17. The inspection system of claim 12, wherein the cable is cut in a profile matching the contour of the side surface of the substrate.

18. The inspection system of claim 12, wherein the side surface of the substrate is substantially perpendicular to the first planar surface and the second planar surface of the substrate.

19. An inspection system for inspecting an object comprising:

a proximity sensor located proximate to the object, wherein the proximity sensor comprises a substrate comprising a first planar surface, a second planar surface, and a side surface and an antenna pattern disposed on the first planar surface and/or the second planar surface of the substrate, wherein the second planar surface of the substrate is substantially opposite the first planar surface of the substrate;

a signal generation and processing component for generating an electrical driving signal that causes generation of an electromagnetic field from the proximity sensor that is directed toward the object, a cable connecting the signal generation and processing component and the proximity sensor, wherein the cable comprises a center conductor and a shield and wherein the cable is connected to the side surface of the substrate and is substantially parallel to the first planar surface and the second planar surface of the substrate;

a first conductive path in the substrate connecting the center conductor of the cable to the antenna pattern;

a second conductive path in the substrate connecting the shield of the cable to the antenna pattern; and a first hole in the side surface of the substrate into which the center conductor of the cable is inserted and electrically connected to the antenna pattern via the first conductive path in the substrate.

20. The inspection system of claim 19, further comprising a second hole in the first planar surface or the second planar surface of the substrate, wherein the second hole provides access to the center conductor inserted into the first hole for soldering the center conductor to the first conductive path.

* * * * *